United States Patent
Fox et al.

(10) Patent No.: US 6,784,072 B2
(45) Date of Patent: Aug. 31, 2004

(54) CONTROL OF BURIED OXIDE IN SIMOX

(75) Inventors: Stephen Richard Fox, Hopewell Junction, NY (US); Neena Garg, Fishkill, NY (US); Kenneth John Giewont, Hopewell Junction, NY (US); Junedong Lee, Hopewell Junction, NY (US); Siegfried Lutz Maurer, Stormville, NY (US); Dan Moy, Bethel, CT (US); Maurice Heathcote Norcott, San Jose, CA (US); Devendra Kumar Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/200,822

(22) Filed: Jul. 22, 2002

(65) Prior Publication Data

US 2004/0013886 A1 Jan. 22, 2004

(51) Int. Cl.[7] .............................................. H01L 21/76
(52) U.S. Cl. ..................... 438/404; 438/407; 438/528
(58) Field of Search ................................ 438/406, 407, 438/404, 459, 423, 530, 526–528

(56) References Cited

U.S. PATENT DOCUMENTS

| | | | | | |
|---|---|---|---|---|---|
| 5,346,841 | A | * | 9/1994 | Yajima | 438/295 |
| 5,930,643 | A | * | 7/1999 | Sadana et al. | 438/407 |
| 6,043,166 | A | * | 3/2000 | Roitman et al. | 438/766 |
| 6,074,929 | A | * | 6/2000 | Thomas | 438/407 |
| 6,090,689 | A | * | 7/2000 | Sadana et al. | 438/480 |
| 6,180,487 | B1 | * | 1/2001 | Lin | 438/407 |
| 6,531,375 | B1 | * | 3/2003 | Giewont et al. | 438/407 |
| 6,602,757 | B2 | * | 8/2003 | Hovel et al. | 438/407 |
| 2003/0194846 | A1 | * | 10/2003 | Hovel et al. | 438/400 |

* cited by examiner

*Primary Examiner*—Tran H. Nguyen
*Assistant Examiner*—David S. Blum
(74) *Attorney, Agent, or Firm*—Scully, Scott, Murphy & Presser; Robert M. Trepp, Esq.

(57) ABSTRACT

A method for forming a semiconductor-on-insulator (SOI) substrate is described incorporating the steps of heating a substrate, implanting oxygen into a heated substrate, cooling the substrate, implanting into a cooled substrate and annealing. The steps of implanting may be at several energies to provide a plurality of depths and corresponding buried damaged regions. Prior to implanting, the step of cleaning the substrate surface and/or forming a patterned mask thereon may be performed. The invention overcomes the problem of raising the quality of buried oxide and its properties such as surface roughness, uniform thickness and breakdown voltage $V_{bd}$.

17 Claims, 5 Drawing Sheets

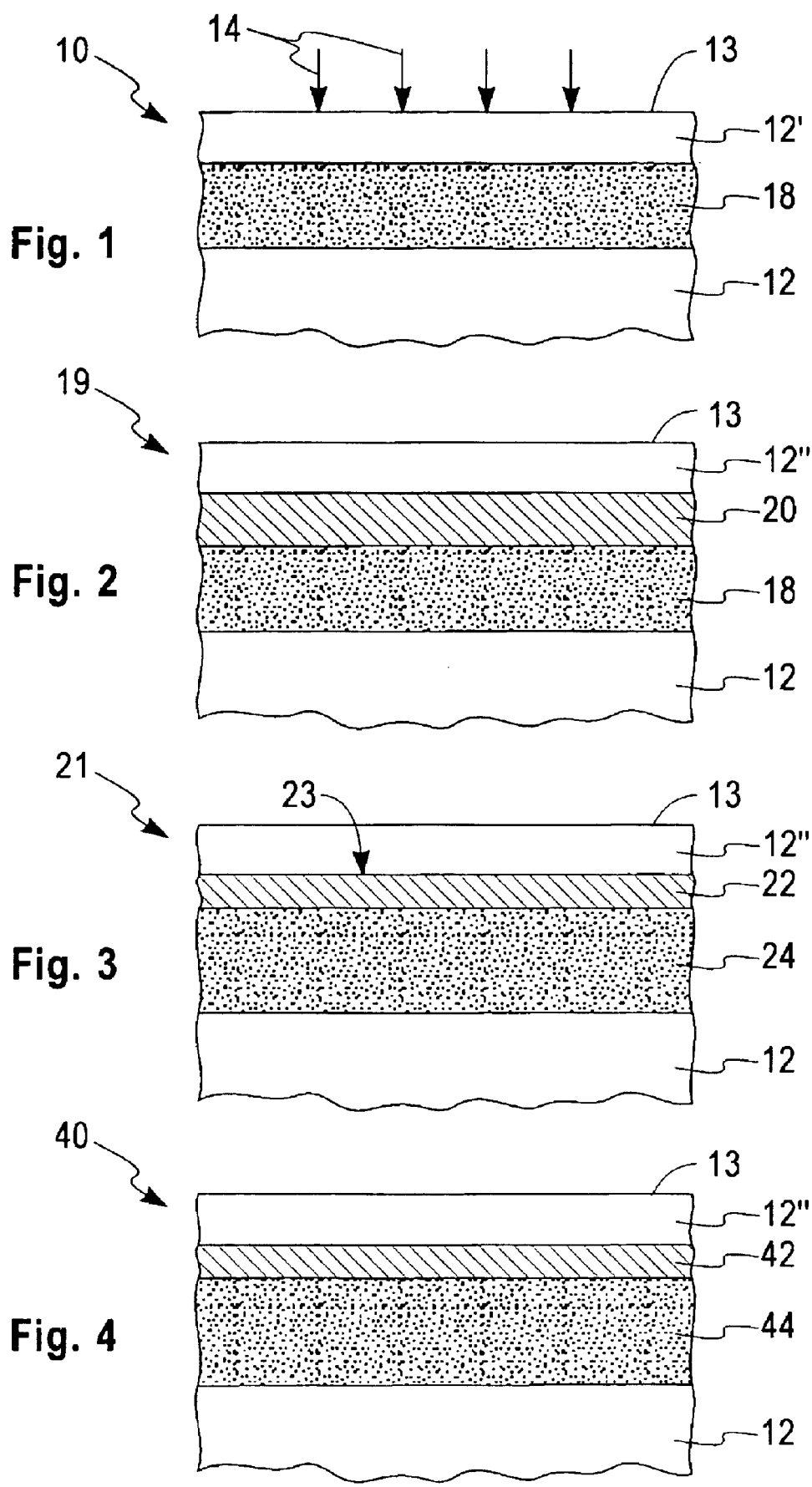

CONTROL OF BURIED OXIDE IN SIMOX

CROSS REFERENCE TO RELATED APPLICATIONS

This application is cross referenced to co-assigned U.S. application Ser. No. 09/861,593 filed May 21, 2001 (YOR919970117US3) which is a continuation-in-part application of U.S. Pat. No. 6,259,137 which issued Jul. 10, 2001 which is a divisional application of U.S. Pat. No. 5,930,643 which issued Jul. 27, 1999; co-assigned U.S. application Ser. No. 09/356,295 filed Jul. 16, 1999 (YOR919990101US1); co-assigned U.S. application Ser. No. 09/861,596 filed May 21, 2001 (YOR920010102US1); co-assigned U.S. application Ser. No. 09/861,594 filed May 21, 2001 (YOR920010103US1); co-assigned U.S. application Ser. No. 09/861,590 filed May 21, 2001 (YOR920010130US1); and co-assigned U.S. application Ser. No. 09/884,670 filed Jun. 19, 2001 (YOR920010104US1), the entire contents of each application and patent are incorporated herein by reference.

FIELD OF THE INVENTION

This invention relates to silicon-on-insulator substrates and more particularly to forming a high quality buried oxide layer by heating a semiconductor substrate, implanting oxygen into the substrate in several incremental steps and annealing the substrate.

BACKGROUND OF THE INVENTION

In order to reduce capacitance and to electrically isolate devices, silicon-on-insulator (SOI) wafers are used in place of bulk Si wafers. One approach to forming an SOI wafer is to use separation by implantation of oxygen (SIMOX) where a buried oxide layer is formed in a wafer by implanting oxygen ions and then annealing at high temperatures.

An example of an advance SIMOX process is described in U.S. Pat. No. 5,930,643 which issued on Jul. 27, 1999 to D. K. Sadana and J. de Souza entitled "Defect Induced Buried Oxide" which describes implanting oxygen into a Si wafer at high temperature to form a stable defect region in the Si followed by implanting oxygen at a temperature below 300° C. to form an amorphous Si region adjacent the stable defect region.

U.S. Pat. No. 6,043,166 which issued Mar. 28, 2000 describes forming a high quality buried oxide (BOX) layer with extremely low doses of oxygen followed by two high temperature oxidation anneals to eliminate defects in the silicon above the buried oxide by forming silicon dioxide as part of the buried oxide in the region where the defects were present.

U.S. Pat. No. 6,090,689 which issued Jul. 18, 2000 describes forming Silicon-on-Insulator substrates incorporating the steps of ion implanting oxygen into a silicon substrate at an elevated temperature, ion implanting oxygen at a temperature below 100 degrees ° C. at a lower dose to form an amorphous silicon layer, and annealing steps to form a mixture of defective single crystal silicon and poly-crystalline silicon or polycrystalline silicon alone from the amorphous silicon layer and then silicon oxide to form a continuous silicon oxide layer below the surface of the silicon substrate to provide an isolated superficial layer of silicon. The low temperature implant results in the formation of a buried amorphous layer at the location where the oxide is to be formed. The amorphous silicon layer contains both dissolved and precipitated oxygen which forms polycrystalline silicon to provide sites for nucleating oxide growth and paths for rapid diffusion of oxygen along the polycrystalline grain boundaries.

SUMMARY OF THE INVENTION

In accordance with the present invention, a method for forming a semiconductor-on-insulator (SOI) substrate having a high quality buried oxide layer is described comprising the steps of selecting a semiconductor substrate containing silicon and having a major surface, heating the semiconductor substrate to a first temperature in the range from 100 to 800° C., first implanting oxygen into the major surface at a first energy to deposit oxygen in a range centered about a first depth whereby a buried damaged region is formed, heating/cooling the semiconductor substrate to a second temperature below 300° C., second implanting oxygen into the major surface at a second energy to deposit oxygen in a range centered about a second depth whereby a buried amorphous region of semiconductor material is formed, heating/cooling the semiconductor substrate to a third temperature in the range from 100 to 800° C., third implanting oxygen into the major surface at a third energy to deposit oxygen in a range centered about a third depth whereby an additional buried damaged region is formed, and annealing the semiconductor substrate above 1100° C. for a first time period to form the high quality buried oxide layer.

The invention further includes the step of cleaning the substrate to remove debris and particulates prior to performing one or more of the steps of first, second, and third implanting.

The invention further includes the step of forming a patterned mask on the substrate prior to performing one or more of the steps of first, second, and third implanting and of removing the patterned mask prior to annealing.

The invention further includes the step of implanting in place of oxygen or with oxygen the elements: nitrogen, carbon, neon, helium, argon, krypton, xenon, fluorine, radon, silicon, aluminum, boron, phosphorus, titanium, chromium, iron, other elements from the Periodic Table or combinations thereof.

BRIEF DESCRIPTION OF THE DRAWING

These and other features, objects, and advantages of the present invention will become apparent upon consideration of the following detailed description of the invention when read in conjunction with the drawing in which:

FIG. 1 is a cross-section view illustrating a first step of the invention where ions are implanted into a wafer to form a damaged region.

FIG. 2 is a cross-section view illustrating a second step of the invention where an amorphous region adjacent the damaged region is formed by ion implantation.

FIG. 3 is a cross-section view illustrating a third step of the invention where atoms are implanted into the wafer to form additional damaged regions including portions of the amorphous region.

FIG. 4 is a cross-section view illustrating a fourth step of the invention where an amorphous region adjacent to or part of the damaged region is formed by ion implantation.

DESCRIPTION OF THE PREFERRED EMBODIMENT

Figure 1A:
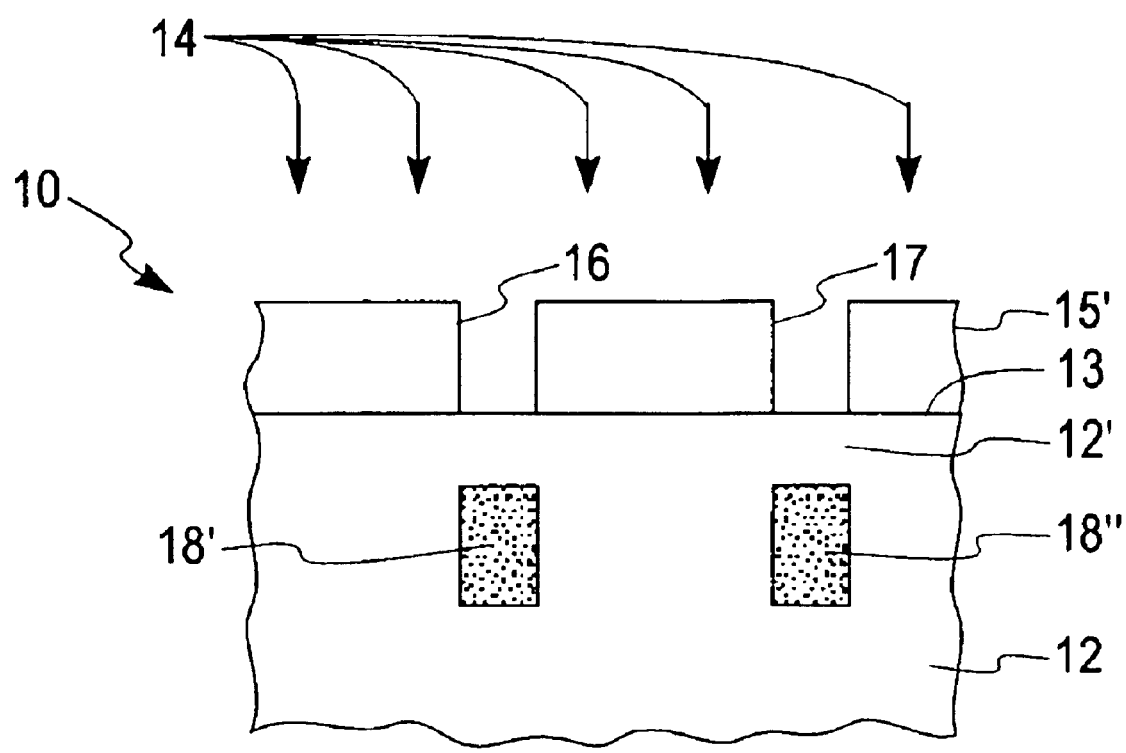
FIG. 1A is a cross-section view illustrating an alternate first step of the invention where ions are implanted through a patterned mask into a wafer to form a corresponding patterned damaged region.

Referring now to the drawing, FIG. 1 is a cross-section view of structure 10 which illustrates a first step in the process of forming a buried oxide region in SIMOX where a substrate 12 is implanted with ions 14 at an energy in the range from 10 keV to 3 MeV. Ions 14 may be, for example, oxygen, nitrogen, carbon, neon, helium, argon, krypton, xenon, fluorine, radon, silicon, aluminum, boron, phosphorus, titanium, chromium, iron or any other element. The energy of ion 14 determines the depth of penetration of ion 14 below surface 13 of substrate 12. The temperature of substrate 12 at the time of ion implantation may be in the range from 100° C. to 800° C. The dose may be in the range from $2\times10^{16}$ to $2\times10^{18}$ ions/cm$^2$. Prior to the first step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as used in the art for cleaning wafers may be used to clean the wafer surface such as an RCA clean process or an IBM Huang clean process. The ion dose of ions 14 implanted into substrate 12 forms damaged region 18 and substrate 12' above.

During implantation in step 1, substrate 12 could be continuously rotated with the plane of the substrate surface at a fixed tilt or angle with respect to the incident ion direction or be implanted at a fixed tilt and at a fixed rotation with respect to the incident ion direction.

If fixed tilt and fixed rotation is used, substrate 12 is rotated for the next step of ion implantation by 20 to 180 degrees to improve the dose uniformity in substrate 12. The rotation of substrate 12 could be repeated prior to each step of ion implantation after the first step of ion implantation for best uniformity in dose of ions 14 in substrate 12.

After implantation in step 1, the substrate 12 including upper surface 13 is cleaned to remove particles which might have been deposited on surface 13 during implantation.

In FIG. 1A, patterned mask 15 is shown formed on upper surface 13 of substrate 12. Patterned mask 15 has openings 16 and 17 permitting ions 14 to pass into substrate 12. Ions 14 pass through openings 16 and 17 to form patterned damage regions 18' and 18". Patterned mask 15 may remain on substrate 12 for subsequent patterning during additional steps of ion implantation. Or, patterned mask 15 may be changed with a new pattern for one or more subsequent steps of implanting ions 14 to create patterned buried structures from buried damaged regions 18" and amorphous regions (not shown) and substrate 12' above.

FIG. 2 is a cross-section view of structure 19 which illustrates the second step of formation of an amorphous region 20 formed above the damaged region 18 in substrate 12". Ions 14 may or may not be the same as used in step 1. Ions 14 are implanted at a reduced temperature below 200° C. The dose may be in the range from $1\times10^{14}$ to $1\times10^{16}$ ions/cm$^2$. A description of forming a damaged region is given in U.S. Pat. No. 5,930,643 which issued Jul. 27, 1999 to D. K. Sadana et al. Depending on the element used to form ion 14, damaged region 18 may contain Si—O, Si—N, Si—C or their combination in precipitate form where the respective element of ions 14 is oxygen, nitrogen or carbon. Prior to the second step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as used in the art for cleaning wafers may be used such as an RCA clean process or an IBM Huang clean process mentioned above.

FIG. 3 is a cross-section view of structure 21 which illustrates the third step of forming a partially regrown region 22 of region 20 in FIG. 2. The third step may be a repeat of step 1 shown in FIG. 1. The regrowth is predominately from the upper interface 23 of the intersection of region 22 and substrate 12'''. This regrowth is assisted by the ion beam or ion implantation and elevated substrate temperature during ion implantation. Region 22 contains stacking faults, microtwins and polycrystalline silicon and oxide precipitates. The temperature of the substrate at the time of ion implantation should be in the range from 100° C. to 800° C. The dose should be in the range from $2\times10^{16}$ to $2\times10^{18}$ ions/cm$^2$. Prior to the third step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as used in the art for cleaning wafers may be used such as an RCA clean process or an IBM Huang clean process. The dose of ions 14 into substrate 12''' forms damaged region 24. Damaged region 24 is increased in thickness and has more damage than damaged region 18.

FIG. 4 is a cross section-view of structure 40 after a fourth step of forming an amorphous region 42. The fourth step may be a repeat of step 2 shown in FIG. 2. Step 4 converts region 22 shown in FIG. 3 into amorphous region 42 shown in FIG. 4. Region 42 may be of different thickness than the thickness of region 22. The temperature during ion implantation is brought down to or less than 200° C. Region 44 is nominally similar to region 24 shown in FIG. 3 with slightly more damage than region 24. Prior to the fourth step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as used in the art for cleaning wafers may be used such as an RCA clean process or an IBM Huang clean process.

Next, a fifth step of annealing converts the structure shown in FIG. 3 or 4 into three possible useful structures for device and circuit applications. The first structure is SOI structure 48 where regions 44 and 42 shown in FIG. 4 are converted to buried oxide region 50 which is shown as a layer in FIG. 5. Above region 50 which was formerly 12''' or 12'''' is now region 52 which is a high quality single crystal silicon layer with some dislocations. Between region 52 and region 50 is a thin region 51 which contains predominately stacking fault tetrahedra. Region 51 is in the range from 10 Å to 1000 Å thick. Region 52 typically has a thickness in the range from about 100 Å to about 3000 Å. Thicker Si may be formed in region 52 by raising the energy of ions 14 during the steps of ion implantation to lower the buried oxide with respect to upper surface 13. The typical dislocation density in region 52 is in the range from $1\times10^2$ to $1\times10^4$ defects/cm². The typical stacking fault tetrahedra density in region 51 is in the range from $1\times10^5$ to $1\times10^6$ defects/cm². Region 52 may be selected from the group consisting of Si, SiGe, and Ge alone or in combination. The fifth step of annealing may be for more than 2 hours at a temperature in the range from 1300 to 1400° C. and with an inert ambient at or greater than 10 percent oxygen.

Figure 5:
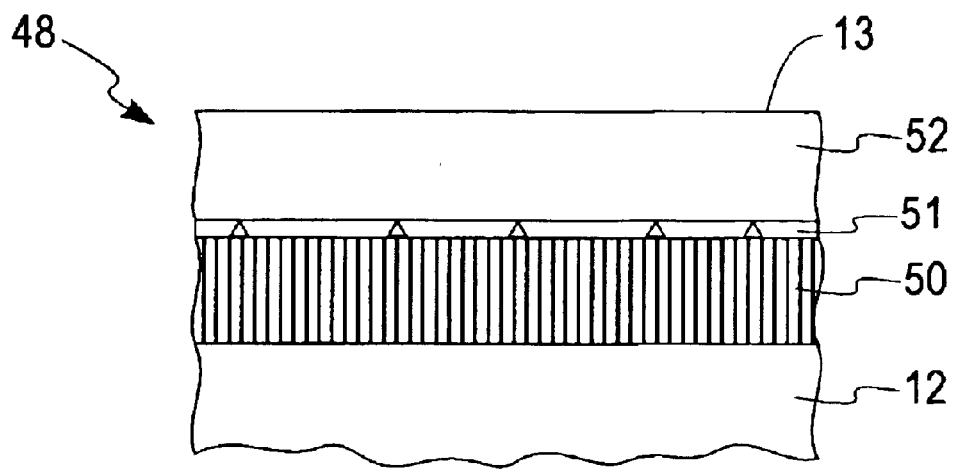
FIG. 5 is a cross-section view illustrating a first structure resulting from the steps illustrated in FIGS. 1–4.
Figure 6:
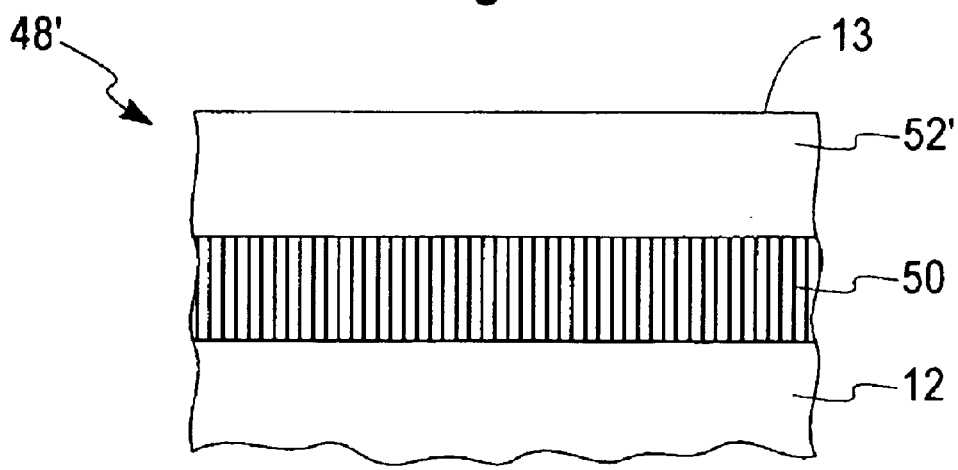
FIG. 6 is a cross-section view illustrating a second structure resulting from the steps illustrated in FIGS. 1–4.

FIG. 6 is the same as FIG. 5 except for the absence of region 51 which included stacking faults tetrahedra or the near absence of stacking faults tetrahedra. Structure 48' is accomplished by longer annealing such as greater than 4 hours at greater than 1320° C. with an inert ambient at or greater than 1% oxygen, for example, argon or nitrogen plus 10 percent oxygen.

Figure 7:
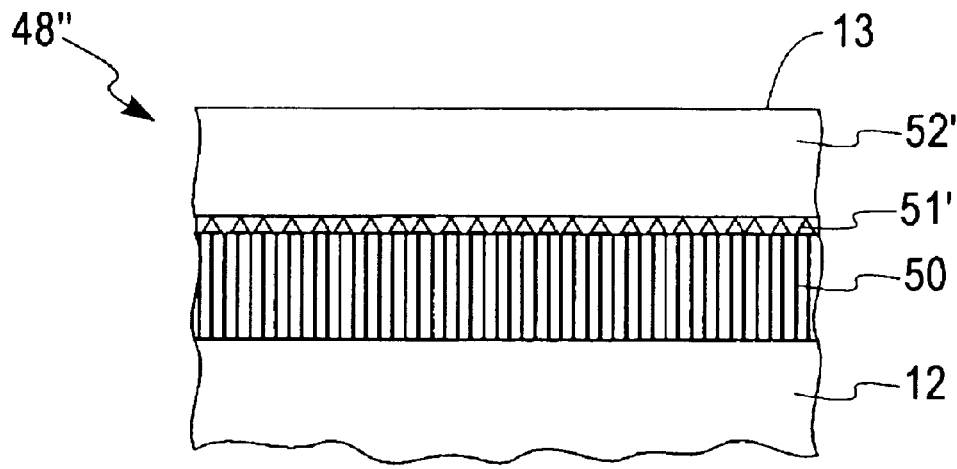
FIG. 7 is a cross-section view illustrating a third structure resulting from the steps illustrated in FIGS. 1–4.

FIG. 7 shows structure 48'' which is the same as FIG. 5 except the density of stacking fault tetrahedra is very high such as in the range from $10\times10^7$ to $10\times10^9$ defects/cm² located in region 51'. In addition to stacking fault tetrahedra, there is a mixture of stacking faults, microtwins and polycrystalline Si. Structure 48'' is accomplished by shorter anneal times such as less than 4 hours at a temperature less than 1320° C. with an inert ambient with less than 10 percent oxygen, for example, argon or nitrogen with 9 percent oxygen. Structure 48' may also be accomplished by forming a cap layer on upper surface 13 of substrate 12''' or 12'''' shown in FIG. 3 or 4 respectively and performing a high temperature anneal. The anneal temperature may be in the range from 1300° C. to 1375° C. for a time greater than 1 hour.

Figure 8:
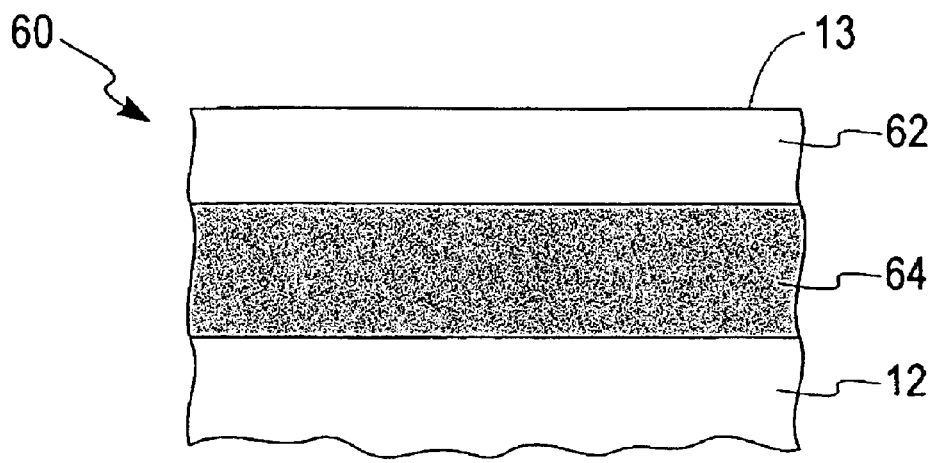
FIG. 8 is a cross-section view illustrating an amorphous buried layer.

FIG. 8 shows structure 60 having region 62 of former substrate 12 and buried amorphous layer 64 formed by oxygen, nitrogen, carbon or another element implanted at a first energy into semiconductor substrate 12 at a temperature below 300° C. Prior to the step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as referred to above may be used. In the case where oxygen, nitrogen or carbon is used, typical dose range may be $1\times10^{14}$ to $1\times10^{16}$ ions/cm² for an energy range of 50 to 400 keV.

Figure 9:
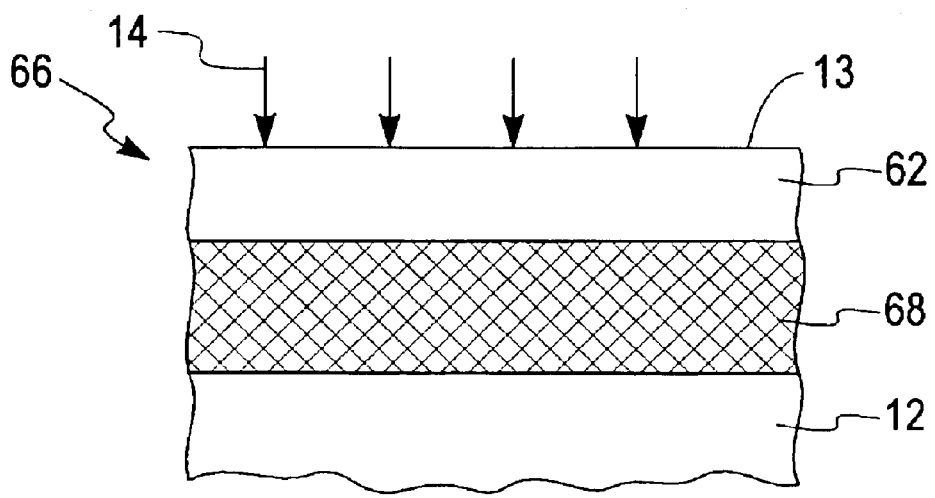
FIG. 9 is a cross-section view illustrating a damaged layer corresponding to the amorphous buried layer of FIG. 8.

FIG. 9 shows structure 66 having damaged layer 68 corresponding to the buried amorphous layer 64 of FIG. 8. Damaged layer 68 is obtained by raising the temperature of substrate 12 and layer 64 in the range from about 100° C. to less than 800° C. and then implanting ions 14 in the dose range from $2\times10^{16}$ to $2\times10^{18}$ ions/cm². Ions 14 may be selected from the group consisting of oxygen, nitrogen, carbon and combinations thereof. Damaged layer 68 may contain $SiO_x$, $Si_xN_y$, $Si_xC_y$, their combination in precipitate form or compounds of Si and the implanted ion element. Prior to the step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as referred to above may be used.

Figure 10:
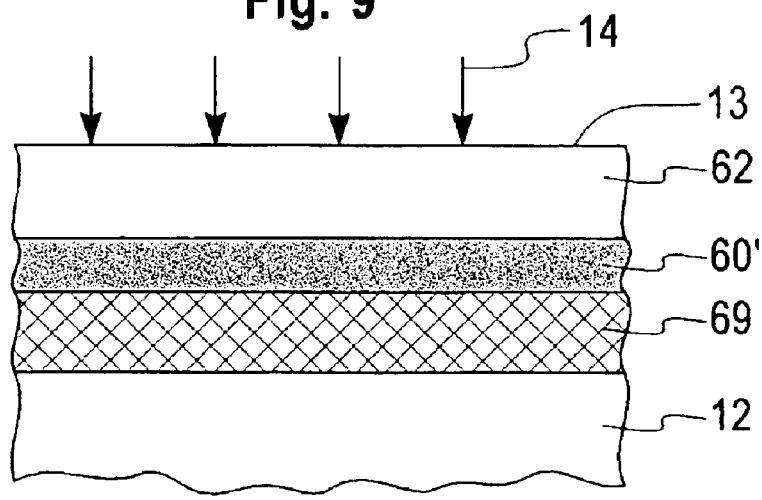
FIG. 10 is a cross-section view illustrating two layers formed from a previously formed single layer shown in FIG. 8.

FIG. 10 shows amorphous layers 60' and damaged layer 69 corresponding to buried amorphous layer 64 of FIG. 8. Layer 60' is the remainder of layer 64 and layer 69 is now damaged layer formed from previous layer 64. Layer 69 may be obtained by raising the temperature of substrate 12 and layer 64 in the range from about 100° C. to less than 700° C. and then implanting ions 14 in the dose range from $5\times10^{16}$ to $2\times10^{18}$ ions/cm². Ions 14 may be selected from the group consisting of oxygen, nitrogen, carbon and combinations thereof. Damaged layer 69 may contain $SiO_x$, $Si_xN_y$, $Si_xC_y$, their combination in precipitate form or compounds of Si and the implanted ion element. Prior to the step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as referred to above may be used.

Figure 11:
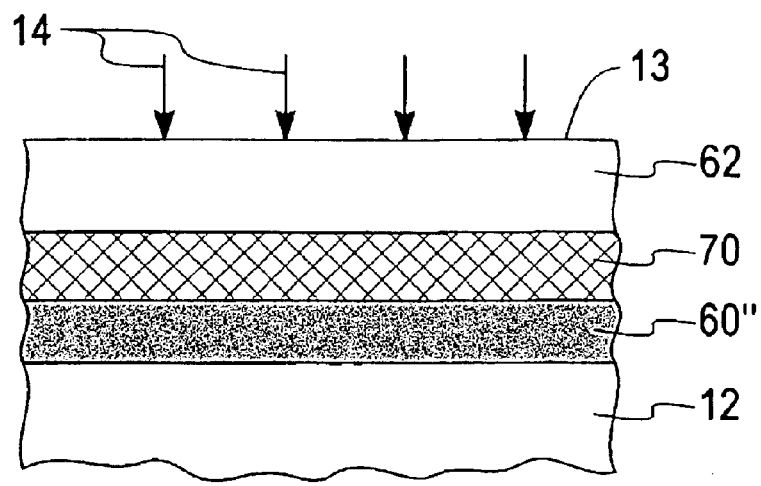
FIG. 11 is a cross-section view illustrating two layers formed from a previously formed single layer shown in FIG. 8.

FIG. 11 shows two layers 70 and 60'' corresponding to buried amorphous layer 64 in FIG. 8. Layer 60'' is part of layer 64 shown in FIG. 8 and layer 70 is now a damaged layer formed from layer 64. Layer 70 may be obtained by raising the temperature of substrate 12 and layer 64 in the range from about 100° C. to less than 700° C. and then implanting ions 14 in the dose range from $5\times10^{16}$ to $2\times10^{18}$ ions/cm². Ions 14 may be selected from the group consisting of oxygen, nitrogen, carbon and combinations thereof. Damaged layer 70 may contain $SiO_x$, $Si_xN_y$, $Si_xC_y$, their combination in precipitate form or compounds of Si and the implanted ion element. Prior to the step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as referred to above may be used.

Figure 12:
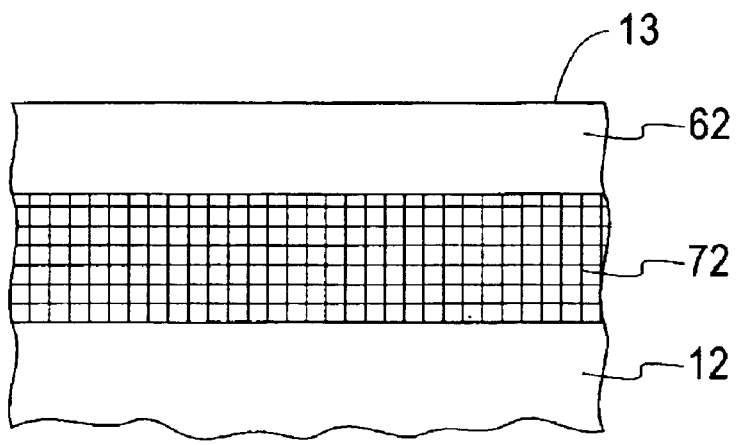
FIG. 12 is a cross-section view illustrating a single layer of crystallographic defects.

FIG. 12 shows a buried layer 72 of crystallographic defects formed by ions 14 of oxygen, nitrogen, carbon or another element implanted at a first energy into layer 64 of semiconductor substrate 12 of FIG. 8 at a temperature above 100° C. Layer 72 is now a damaged layer formed from layer 64. In the case where oxygen, nitrogen or carbon is used, the typical dose is in the range from $1\times10^{14}$ to $1\times10^{16}$ ions/cm² for an energy range of 50 keV to 400 keV. Crystallographic defects in layer 72 may contain dislocations, stacking faults, twins, microtwins, precipitates and their combinations. Prior to the step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as referred to above may be used.

Figure 13:
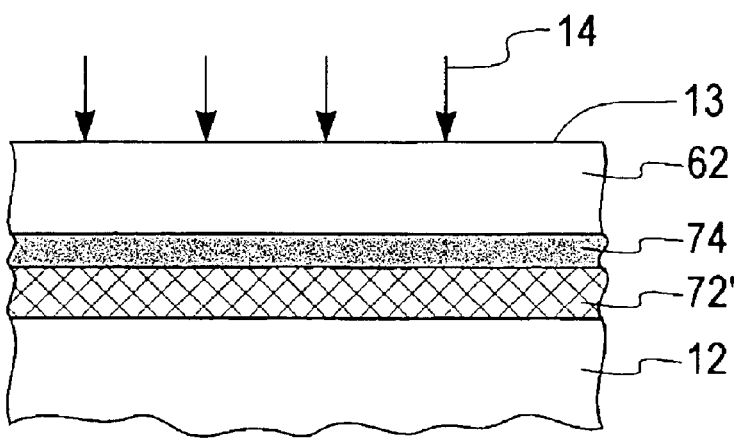
FIG. 13 is a cross-section view illustrating two layers formed from the single layer 72 shown in FIG. 12.

FIG. 13 shows two layers 74 and 72' corresponding to buried layer 72 of FIG. 12. Layer 72' is the remainder of layer 72 and layer 74 is now an amorphous layer. Layer 74 may be obtained by lowering the temperature of substrate 12 and layer 72 to below 100° C. and then implanting oxygen, nitrogen, carbon or other elemental ions 14 at a dose in the range from $1\times10^{14}$ to $5\times10^{16}$ ions/cm². Amorphous layer 74 may contain $SiO_x$, $Si_xN_y$, $Si_xC_y$, their combination in precipitate form or compounds of Si and the implanted ion element. Prior to the step of implanting, upper surface 13 of substrate 12 should be clean without any surface oxides, particulates and/or other material; or, upper surface 13 can have a thin layer thereon of dielectric material having a thickness in the range from 50 Å to 5000 Å. A standard industry clean procedure such as referred to above may be used.

In FIGS. 1–13, like elements or components are referred to by like and corresponding reference numerals.

While there has been described and illustrated a process for forming a SOI substrate containing a structure including high quality buried oxide and a process for forming buried amorphous and damaged layers in a substrate, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for forming a semiconductor-on-insulator (SOI) substrate having a high quality buried oxide layer comprising the sequential steps of;

selecting a semiconductor substrate containing silicon and having a major surface, heating said semiconductor substrate to a first temperature above 100 degrees C., first implanting oxygen into said major surface at a first energy to deposit oxygen in a range centered about a first depth whereby a buried damaged region is formed, heating/cooling said semiconductor substrate to a second temperature below 300 degrees C., second implanting oxygen into said major surface at a second energy to deposit oxygen in a range centered about a second depth whereby a buried amorphous region of semiconductor material is formed, third implanting oxygen into said major surface at a third energy and at a temperature in a range from 100 to 800 degrees C. to deposit oxygen in a range centered about a third depth whereby an additional buried damaged region is formed, and annealing said semiconductor substrate above 1100 degrees C. for a first time period to form said high quality buried oxide layer.

2. The method of claim 1 wherein said step of third implanting oxygen is followed by the step of fourth implanting oxygen unto said major surface at a fourth energy to deposit oxygen in a range centered about a fourth depth whereby an additional amorphous region of semiconductor material is formed.

3. The method of claim 1 wherein said step of selecting a semiconductor substrate is followed by the step of:

forming a patterned mask on said major surface whereby oxygen ions me absorbed by said mask, and prior to said step of annealing, removing said patterned mask from said major surface.

4. The method of claim 2 wherein said step of selecting a semiconductor substrate is followed by duo step of:

forming a patterned mask on said major surface whereby oxygen ions are absorbed by said mask, and prior to said step of annealing, removing said patterned mask from said major surface.

5. The method of claim 2 wherein said step of fourth implanting oxygen is followed by the steps of:

hosting said semiconductor substrate to a temperature above 100° C.

fifth implanting oxygen into said major surface at a fifth energy to deposit oxygen in a range centered about a fifth depth whereby a buried damaged region is formed, heating/cooling said semiconductor substrate to a temperature below 300° C., sixth implanting oxygen into said major surface at a sixth energy to deposit oxygen in a range centered about a sixth depth whereby a buried amorphous region of semiconductor material is formed.

6. The method of claim 2 wherein said step of first implanting is followed by the stop of:

forming a patterned mask on said major surface whereby oxygen ions during said step of second implanting are absorbed by said mask, and prior to said step of annealing, removing said patterned mask from said major surface.

7. The method of claim 2 wherein said step of second implanting is followed by the step of:

forming a patterned mask on said major surface whereby oxygen ions during said atop of third implanting are absorbed by said mask, and prior to said step of annealing, removing said patterned mask from said major surface.

8. The method of claim 2 wherein said atop of third implanting is followed by the step of:

forming a patterned mask on said major surface whereby oxygen ions during said atop of fourth implanting are absorbed by said mask, and prior to said step of annealing, removing said patterned mask from said major surface.

9. The method of claim 5 wherein said step of fourth implanting is followed by the step of:

forming a patterned mask on said major surface whereby oxygen ions during said step of fifth implanting are absorbed by said sneak, and prior to said step of annealing removing said patterned mask from said major surface.

10. The method of claim 1 wherein mid stop of third implanting includes the step of selecting the value of said third energy with suspect to said second energy whereby said second and third depths are spaced to overlap implantations to change a portion of said buried amorphous region to an additional buried damaged region.

11. The method of claim 1 wherein said atop of first implanting includes the step of positioning said substrate with a fixed tilt with respect to the incident ion direction.

12. The method of claim 1 wherein said step of first implanting includes the step of rotating said substrate with a fixed tilt with respect to the incident ion direction.

13. The method of claim 1 wherein said first step of implanting is at about one half dose A, said second step of implanting is at full dose B and said third step of implanting is at about one half dose A where dose A is in the range from $2\times10^{16}$ to $2\times10^{18}$ ions/cm$^2$ and where dose B is in the range from $1\times10^{14}$ to $1\times10^{16}$ ions/cm$^2$.

14. The method of claim 2 wherein said first step of implanting is at about one half dose A, said second step of implanting is at about one half dose B, said third step of implanting is at about one half dose A and said fourth step of implanting is at about one half dose B where dose A is in the range from $2\times10^{15}$ to $2\times10^{18}$ ions/cm$^2$ and wherein dose B is in the range from $1\times10^{14}$ to $1\times10^{16}$ ions/cm$^2$.

15. A method for forming a buried structure in a substrate comprising the sequential steps of:

selecting a semiconductor substrate containing silicon and having a major surface, heating said semiconductor substrate to a first temperature above 100 degrees C., first implanting first ions into said major surface at a first energy to deposit first atoms in a range centered about a first depth whereby a buried damaged region is formed, heating/cooling said semiconductor substrate to a second temperature below 300 degrees C., second implanting second ions into said major surface at a second energy to deposit second atoms in a range centered about a second depth whereby a buried amorphous region of semiconductor is formed, third implanting third ions into said major surface at a third energy and at a temperature in a range from 100 to 800 degrees C. to deposit third atoms in a range centered about a third depth whereby an additional buried damaged region is formed, and annealing said semiconductor substrate above 1100 degrees C. for a first time period to form at least one silicon compound containing region in said buried structure.

16. The method of claim 15 wherein said step of first implanting includes ion implanting nitrogen, carbon, neoen, helium argon, krypton, xenon, fluorine, radon, silicon, aluminum, baron, phosphorus, titanium, chromium, iron, or other elements from the Periodic Table or combinations thereof.

17. The method of claim 15 wherein said step of first implanting includes ion implanting oxygen.

* * * * *

UNITED STATES PATENT AND TRADEMARK OFFICE
CERTIFICATE OF CORRECTION

PATENT NO. : 6,784,072 B2
DATED : August 31, 2004
INVENTOR(S) : Stephen Richard Fox et al.

It is certified that error appears in the above-identified patent and that said Letters Patent is hereby corrected as shown below:

Column 7,
Line 41, "unto" should read -- into --
Line 52, "duo" should read -- the --
Line 59, "hosting" should read -- healing --

Column 8,
Line 4, "stop" should read -- step --
Line 17, "atop" should read -- step --
Line 28, "sneak" should read -- mask --
Line 30, "mid stop" should read -- said step --
Line 33, "suspect" should read -- respect --
Line 36, "atop" should read -- step --
Line 53, "wherein" should read -- where --

Signed and Sealed this

Seventh Day of June, 2005

JON W. DUDAS
*Director of the United States Patent and Trademark Office*